(12) United States Patent
Leibovici et al.

(10) Patent No.: US 10,712,670 B1
(45) Date of Patent: *Jul. 14, 2020

(54) VARIABLE NEUTRAL DENSITY FILTER FOR MULTI-BEAM INTERFERENCE LITHOGRAPHY EXPOSURE

(71) Applicant: Facebook Technologies, LLC, Menlo Park, CA (US)

(72) Inventors: Matthieu Charles Raoul Leibovici, Seattle, WA (US); Matthew E. Colburn, Woodinville, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/686,241

(22) Filed: Nov. 18, 2019

Related U.S. Application Data

(63) Continuation of application No. 16/044,046, filed on Jul. 24, 2018, now Pat. No. 10,509,327.

(51) Int. Cl.
*G03F 7/20* (2006.01)
*G02B 5/20* (2006.01)
*G02B 5/18* (2006.01)

(52) U.S. Cl.
CPC ......... *G03F 7/70408* (2013.01); *G02B 5/205* (2013.01); *G03F 7/70191* (2013.01); *G02B 5/1857* (2013.01)

(58) Field of Classification Search
CPC ... G02B 5/1857; G02B 5/205; G03F 7/70191; G03F 7/70408
USPC ........................................... 355/67, 71
See application file for complete search history.

(56) References Cited

U.S. PATENT DOCUMENTS

2003/0157415 A1  8/2003  Ziger
2009/0002657 A1  1/2009  Cho et al.
2013/0017495 A1  1/2013  Kodera et al.

FOREIGN PATENT DOCUMENTS

KR       101527396 B1    6/2015

*Primary Examiner* — Colin W Kreutzer
(74) *Attorney, Agent, or Firm* — Fenwick & West LLP

(57) ABSTRACT

A method comprises disposing a photosensitive film layer on a surface of a substrate layer and placing a variable neutral density (ND) filter such that a surface of the variable ND filter faces an exposure region of the photosensitive film layer. The variable ND filter is a thin film that has an attenuation profile that modulates transmittance of light passing through the variable ND filter to the exposure region to cancel out an uneven power distribution in an intermediate interference exposure pattern at the exposure region of the photosensitive film layer. The method further comprises arranging one or more laser generators such that at least two generated beams of light from the one or more laser generators intersect with each other and form the intermediate interference exposure pattern that is modulated by the variable ND filter to form a target interference exposure pattern at the exposure region.

10 Claims, 13 Drawing Sheets

US 10,712,670 B1

VARIABLE NEUTRAL DENSITY FILTER FOR MULTI-BEAM INTERFERENCE LITHOGRAPHY EXPOSURE

CROSS REFERENCE TO RELATED APPLICATIONS

This application is a continuation of co-pending U.S. application Ser. No. 16/044,046, filed Jul. 24, 2018, which is incorporated by reference in its entirety.

BACKGROUND

The present disclosure generally relates to multi-beam interference lithography, and specifically to using variable neutral density filters and/or refraction cancelling prisms to improve interference exposure patterning on photosensitive film.

Multi-beam interference lithography (MBIL) utilizes multiple coherent, monochromatic beams of electromagnetic (EM) radiation, such as laser light superimposed against each other to create an interference pattern along multiple dimensions which can be used to expose photosensitive film (PR) to create complex patterns in a semiconductor fabrication process. However, traditional MBIL presents various shortcomings. First, due to the non-uniform distribution of power in the wave front of an interfering beam, the resulting photosensitive film pattern may not be exactly as desired. This is not ideal where precision and small feature sizes are required. Additionally, refraction between the air and photosensitive film interface limit the degree of slant at which the beams of EM radiation can be set at (depending on wavelength), and in turn limits the types of patterns that can be created. Hence, an improved means of MBIL is desired.

SUMMARY

A manufacturing system for creating optical components (e.g., optical gratings). The system comprises a variable neutral density (ND) filter that has a first surface and a second surface that is opposite the first surface. The second surface is closer to an exposure region of a photosensitive film layer than the first surface. The photosensitive film layer is disposed on a surface of a substrate layer, and the variable ND filter has an attenuation profile that modulates transmittance of light passing through the variable ND filter to the exposure region. The system also includes one or more laser generators, each generating a coherent beam of light. The plurality of laser generators are arranged such that at least two of the generated coherent beams of light intersect with each other and form an intermediate interference exposure pattern that is modulated by the variable ND filter to form a target interference exposure pattern at the exposure region of the photosensitive film layer. The variable ND filter modulates the transmittance of the coherent beams as they pass through the variable ND filter. As the coherent beams may have an uneven power distribution, the intermediate interference exposure pattern generated by the coherent beams may be undesired. However, the variable ND filter, by modulating the transmittance of the coherent beams, is capable of correcting for any uneven power distribution and allow the generation of the target interference exposure pattern at the exposure region.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

Methods of improving the patterning on a photosensitive film using multi-beam interference lithography (MBIL) are described herein. In one embodiment, a neutral density (ND) filter is placed upon the surface of a photosensitive film such that the interfering coherent beams of an MBIL configuration pass through the variable ND filter before striking the photosensitive film. The variable ND filter modulates the power distribution of the coherent beams. This allows for the pattern on the photosensitive film to be uniform or within desired characteristics, and thus the photosensitive film does not suffer from undesired or uneven patterning due to the non-uniform power distribution of the wave front of the interfering coherent beams. In another embodiment, a prism is placed above the photosensitive film in order to cancel out or significantly remove the effect of the refraction of the interfering photosensitive film beams at the air-PR interface. The prism can either match the refractive index of the PR or be shaped such that the refraction caused by the air-PR interface is significantly cancelled out. This allows for a larger degree of angular positioning of the interfering beams, thus allowing for additional patterns to be created in the PR, whereas previously the angles of the interfering beams were limited to avoid the beam in the PR exceeding the normal vector. In another embodiment, the variable neutral density filter and the prism are combined to reduce both refractive effects and uneven power distribution issues.

Figure 1:
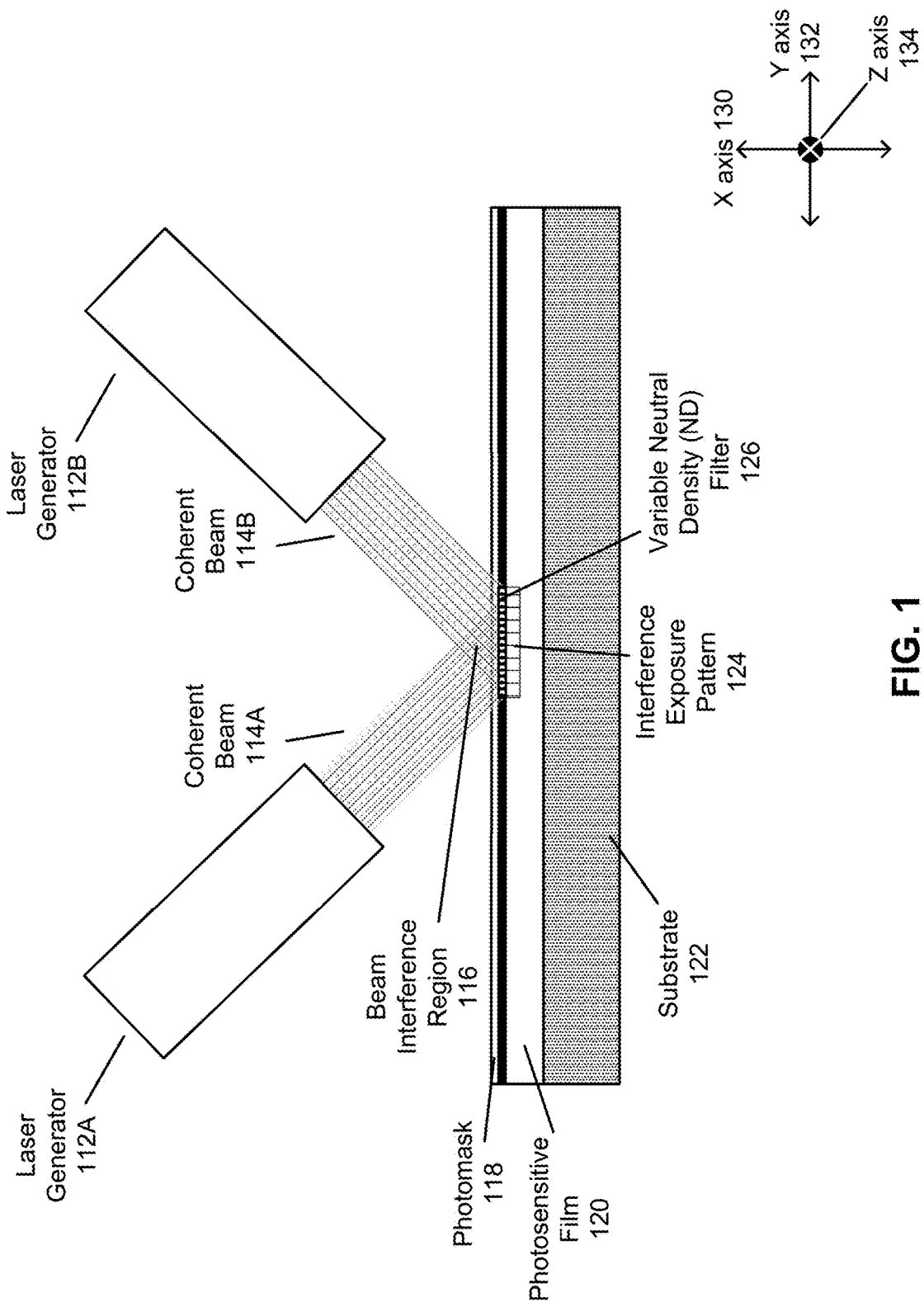
FIG. 1 is a diagram illustrating a profile view of a system for multi beam interference lithography (MBIL) using a variable neutral density filter, according to one or more embodiments.

FIG. 1 is a diagram illustrating a profile view of a system 100 for multi beam interference lithography (MBIL) using a variable neutral density (ND) filter, according to one or more embodiments. The system 100 illustrates some of the components in MBIL, but may leave others out for clarity. The system 100 includes two laser generators 112A and 112B that generate coherent beam 114A and coherent beam 114B, respectively, which interfere at a beam interference region 116. The beams are directed towards a structure that includes a substrate 122, a photosensitive film 120, and a photomask 118. At the layer of the photomask 118 is a variable ND filter 126.

The substrate 122 provides a foundation for the photosensitive film 120 and photomask 118. The substrate 122 may serve as a temporary staging platform for the photosensitive film 120 and the photomask 118 during the MBIL process, or may be a part of a completed product. It may be any polymer, semiconductor, or other material on which a photosensitive film 120 may be deposited, placed, or formed. The photosensitive film 120 may be adhered to the substrate 122 using a glue material. The substrate 122 may be of a uniform material or may be a combination of materials. The substrate 122 may itself be a set of integrated circuits which were formed previously in the fabrication process.

The laser generators 112A-B generate the coherent beams 114A-B (respectively) of coherent EM radiation which are of a single wavelength or within a small range of wavelengths (e.g., >100 Hz). In one embodiment, the EM radiation is of a smaller wavelength than visible light (e.g., deep ultraviolet). The size of the coherent beams 114A-B are such that they interfere to create an interference exposure pattern 124 of a desired size, as specified by an operator or by a design file or document. Each laser generator 112A-B is angled (slanted) at a degree such that the generated coherent beams 114A-B are incident on the photosensitive film 120 at the desired target area, the beam interference region 116. The coherent beams 114A-B may be angled relative to each other at an angle greater than zero degrees. Furthermore, the wavelength of EM radiation that is generated, phase of the EM radiation, angle of the laser generators, number and physical shape and layout of the beams, power of each beam, duration of each beam, and so on, are configured at each laser generator 112A-B such that the interference between the two coherent beams 114A-B create a specific interference exposure pattern 124 in the photosensitive film 120. After the photosensitive film 120 is exposed to the interference exposure pattern 124, some portions of the photosensitive film at the site of the interference exposure pattern 124 are exposed to EM radiation, where constructive interference has occurred, and some portions are not exposed, where destructive interference has occurred. This creates a pattern of exposures, which may be of one or multiple dimensions depending on the configuration of the laser generators 112A-B and coherent beams 114A-B. For example, in the case of a one dimensional pattern, which is the exemplary case illustrated in FIG. 1, laser generator 112A generates coherent beam 114A, and later generator 112B generates coherent beam 114B. These two beams interfere at the beam interference region 116, and cause an interference pattern to be generated. This pattern creates regions of exposure and regions of non-exposure at the photosensitive film 120, creating the interference exposure pattern 124 at the photosensitive film 120.

After the photosensitive film 120 is developed (using, e.g., a developer solution), the areas of the photosensitive film 120 which are exposed are modified according to the intensity of the exposure (to the light). The laser generators 112A-B may be any type of device capable of generating the coherent beams 114A-B, such as a gas, chemical, excimer, solid-state, fiber, photonic crystal, dye, or free-electron laser. For example, the laser may be a nitrogen gas laser.

In one embodiment, the laser generators 112A-B are substituted for a single laser generator, and the coherent beams 114A-B are created via beam splitters that split the beam of the single laser generator into the coherent beams 114A-B. In one embodiment, each of the laser generators 112A-B are substituted with a point light source and a collimating lens. In another embodiment, the interference pattern is created using two or more phase or diffraction gratings, with EM radiation (e.g., EM radiation of the same frequency as that generated by the laser generators) passed through these gratings to generate the interference patterns which is made incident upon the photosensitive film 120.

Although two laser generators 112A-B and two coherent beams 114A-B slanted at two angles are illustrated, in other embodiments the angles, width, number of laser generators, number of coherent beams, and so on can vary in order to achieve the target interference exposure pattern 124.

The photomask 118 is made of a material that blocks the EM radiation of the coherent beams 114A-B from contacting the photosensitive film 120 at pre-determined areas of the photosensitive film 120. By blocking the EM radiation, the photosensitive film 120 is not exposed at the pre-determined areas, but exposed at a region corresponding to the area of the interference exposure pattern (i.e., the exposure region). This photomask 118 may be used to avoid exposure to the EM radiation of the coherent beams 114A-B at undesired areas of the photosensitive film 120, and may also be used to clearly define a sharp boundary between the exposed and non-exposed areas of the photosensitive film 120. Due to the diffraction of the coherent beams 114A-B, without a photomask 118, the photosensitive film 120 may be exposed to EM radiation outside the area designated for the interference exposure patters 124.

As will be described further with regard to FIG. 8A-C, in one embodiment, the photomask 118 is composed of a transparent layer and a reflective layer. The transparent layer is made of any material (e.g., glass) transparent to the EM radiation of the coherent beams 114A-B, and the reflective layer is made of any material reflects or is opaque to the same radiation, such as a metal or polymer (that is thick enough to block the light generated by the laser generators).

The photosensitive film 120 is a material that changes in proportion to the amount of exposure to the wavelength of the EM radiation of the coherent beams 114A-B. The photosensitive film 120 may be any type of photoresist, polymer film, holographic photopolymer, and so on. In the case where the photosensitive film 120 is a photoresist, the areas of the photoresist where it was exposed to light may remain, with the non-exposed regions etched away (e.g., by a solvent solution). In the case where the photosensitive film 120 is a polymer film, the film may be developed using a post-exposure baking step, after which an amount of material dissolved away by a solution is proportional to the intensity of light exposure in that area. In the case of a holographic photopolymer, the refractive index of the holographic photopolymer increases proportional to the intensity of light exposure at that area. The photosensitive film 120 may be made of various known photosensitive film materials that react to EM radiation (e.g., photopolymeric, photodecomposing, and/or photocrosslinking materials). An example of a photosensitive film material is diazonaphthoquinone, which adsorbs at ultraviolet and violet wavelengths of EM radiation.

As noted, based on the interference exposure patterns 124, different portions of the photosensitive film 120 are exposed to the constructively interfering EM radiation from the coherent beams 114A-B. After development, this can produce one, two, or three dimensional patterns based on the configuration of the beams. Such an interference method is a relatively inexpensive method of generating nanoscale patterns in photosensitive film which may then be used in further photolithographic processes to create a final integrated circuit at these nanoscale dimensions. However, due to the uneven power distribution of the beams, the actual or intermediate interference exposure patterns which are created at the photosensitive film 120 may not match a target interference exposure pattern as configured by an operator or in a design file. For example, the power distribution of each of the beams of the coherent beams 114A-B may be non-uniform, e.g. Gaussian, and thus the interference fringe linewidth, or duty cycle, varies over the width of interference area.

To resolve this issue, in one embodiment, a variable ND filter 126 is placed at the photomask 118 and between the coherent beams 114A-B and the photosensitive film 120 in order to modulate the power distribution of the interference pattern of the coherent beams 114A-B at the beam interference region 116. The variable ND filter is a thin film of interferometry grade quality which has a pattern created thereon that modulates the power distribution of the interference pattern such that the interference pattern that is ultimately transmitted to the photosensitive film 120 is of the target interference exposure patterns 124. This variable ND filter 126, placed between the coherent beams 114A-B and the photosensitive film 120, eliminates the variations in the actual interference exposure patterns 124 due to the non-uniform nature of the coherent beams 114A-B generated by the laser generators 112A-B. Additional details regarding the configuration of the variable ND filter 126 are described below with reference to FIGS. 2-3.

Figure 2:
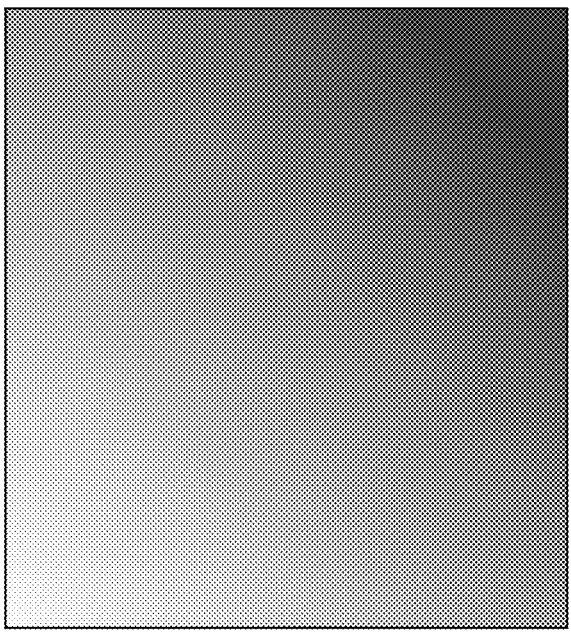
FIG. 2 illustrates two exemplary configurations of the variable ND filter, according to one or more embodiments.
Figure 2:
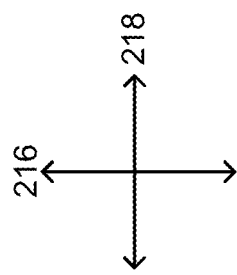
Figure 2:
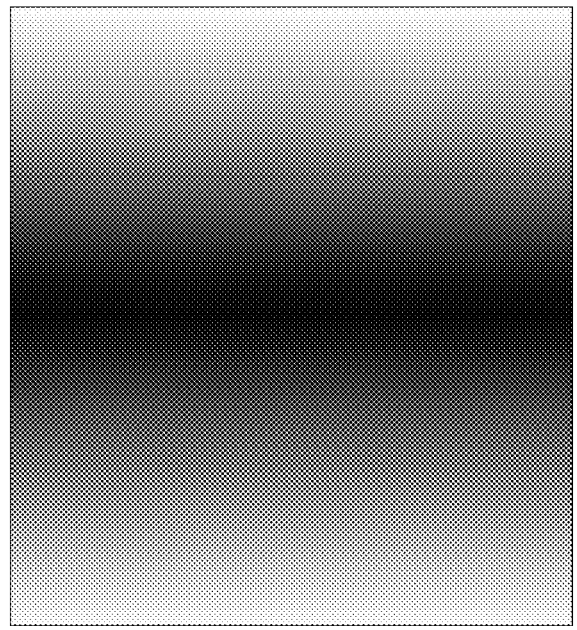

FIG. 2 illustrates two exemplary configurations of the variable ND filter 126, according to one or more embodiments. The exemplary configurations of the variable ND filter 126 include a variable one dimensional (1D) ND filter 212 and a variable two dimensional (2D) ND filter 214.

The variable 1D ND filter 212 modulates the power distribution (i.e. amplitude) of the interfering coherent beams of a MBIL process, e.g., the coherent beams 114A-B, along a direction perpendicular to the direction of change of the gradient of the variable 1D ND filter 212. In the illustrated example, the gradient is changes along the horizontal direction 218. In the system 100, the variable 1D ND filter 212 may be placed in the photomask 118 between the photosensitive film 120 and the coherent beams 114A-B, orientated with the direction of the gradient perpendicular to the axis that includes the two coherent beams 114A-B (e.g., parallel to the z axis 134 and orthogonal to the x-y plane, represented by the x axis 130 and the y axis 132). The gradient pattern across the variable 1D ND filter 212 changes smoothly across the whole interference pattern to counter the effect of the changing intensity of the interfering coherent beams. As shown, the lighter areas attenuate less of the EM radiation emitted by the laser generators (e.g., laser generators 112A-B) compared to the darker areas. This pattern of the variable 1D ND filter 212 allows the variable 1D ND filter 212 to modulate any uneven transmittance of the interfering coherent beams 114A-B in order to generate the target interference exposure pattern 124 and significantly or completely eliminate any undesired effects from the interfering coherent beams 114A-B. In other words, the pattern in the variable 1D ND filter 212 causes the extra power transmittance from the coherent beams 114A-B that exceed a cutoff or desired constant power level to be reduced, and/or causes power transmittance from the coherent beams 114A-B which are below the desired power level to be removed. This results in a clean interference exposure pattern 124 that matches a target design.

The variable 1D ND filter 212 may be made of long polymers which are arranged perpendicular to the direction of the gradient of the variable 1D ND filter 212. These long polymers may be partially or completely opaque to the EM radiation of the coherent beams 124. For example, the polymers may be created by stretching various plasticine films. The thickness, density, and/or type of polymers may vary to vary the amount of transmittance (of the EM radiation) that is allowed through the variable 1D ND filter 212 at that location. However, the overall thickness of the variable 1D ND filter 212 is relatively thin compared to the wavelength of the EM radiation of the coherent beams 114A-B so as to not affect the angle of the EM radiation due to effects such as refraction. For example, the thickness may be $\frac{1}{10}^{th}$ or $\frac{1}{20}^{th}$ of the wavelength.

Although repeating particular gradient pattern of lighter and darker areas is illustrated here, in other embodiments the pattern of the variable 1D ND filter 212 is different in order to differently modulate the EM radiation of the interfering coherent beams 114A-B to generate a different interference exposure pattern 124. As described in further detail with reference to FIG. 3, the attenuation profile, i.e., pattern, on the variable 1D ND filter 212 may be periodic (e.g., sinusoidal, saw tooth, square, triangle) or non-periodic, and may be generated based on a subtraction of the intermediate, or actual interference exposure pattern, with the target (or desired) interference exposure pattern.

The variable two dimensional (2D) ND filter 214 is similar to the variable 1D ND filter 212, but varies not only in the horizontal direction (218) as with the variable 1D ND filter 212, but also varies in the vertical direction (216). This allows the variable 2D ND filter 214 to modulate the power of a set of interfering coherent beams in two dimensions. Such a filter would be used in an arrangement of coherent beams which create two dimensional interference pattern (e.g., three separate beams intersecting at three different angles), used to expose a photomask with a two dimensional pattern that varies in two orthogonal directions (e.g., the vertical direction 216 and the horizontal direction 218). The properties of the variable 2D ND filter 214 may be similar to that of the variable 1D ND filter 212, with similar materials and construction. The variable 2D ND filter 214 may be constructed of one set stretched polymers which are overlaid over another set of stretched polymers at a 90 degree angle. These two sets of polymers may be adhered together using an adhesive, via thermal bonding, or some other method. Additional ablation or removal of material in the combined set of polymers may be performed to create the final pattern for the variable 2D ND filter 214. As with the variable 1D ND filter 212, as illustrated, the lighter regions may allow (transmit) more EM radiation compared to the darker regions. Furthermore, the illustrated pattern is exemplary only, and a different pattern in the variable 2D ND filter 214 may be created based on some other attenuation profile.

Figure 3:
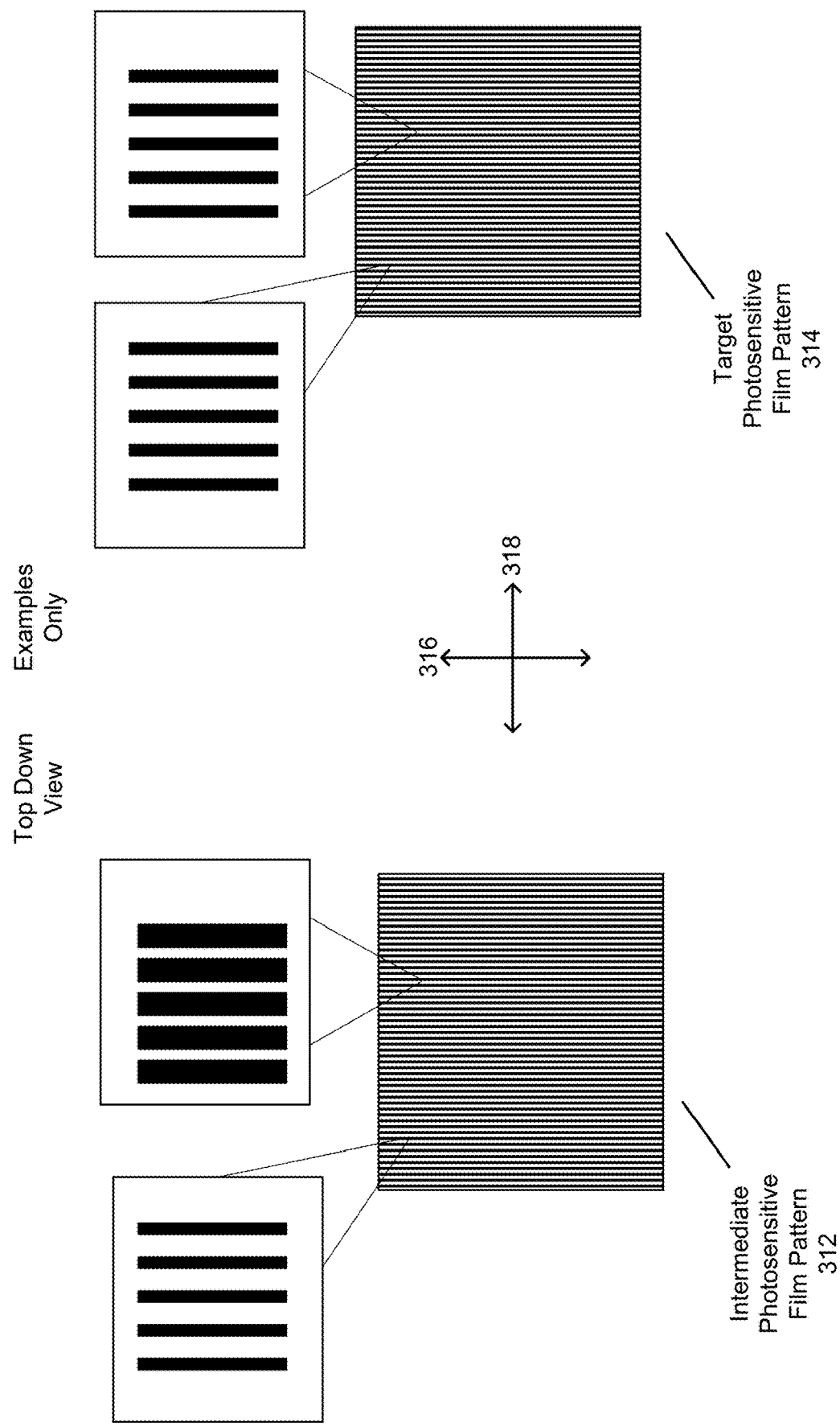
FIG. 3 illustrates examples of the interference exposure pattern on the photosensitive film before and after the application of a variable ND filter to modulate the power of the applied interfering coherent beams, according to one or more embodiments.

FIG. 3 illustrates examples of the interference exposure pattern on the photosensitive film before and after the application of a variable ND filter to modulate the power of the applied interfering coherent beams, according to one or more embodiments.

The intermediate photosensitive film pattern 312 is an example of an intermediate interference exposure pattern generated on the photosensitive film (e.g., photosensitive film 120) due to the imperfections in the interference pattern created by the coherent beams 114A-B as described above. In contrast, the target photosensitive film pattern 314 is an example of a target interference exposure pattern on the photosensitive film 120. The intermediate photosensitive film pattern 312 has vertical bands (which may correspond to the exposed regions) which vary in dimension along the horizontal axis 218 compared to other vertical bands in the intermediate photosensitive film pattern 312. The varying dimensions may be caused by variations in the intensity of the coherent beams (e.g., coherent beams 114A-B). These are the variations for which the variable ND filter 126 is designed to cancel out (i.e. avoid). Note that as with the exemplary variable ND filters of FIG. 2, these photosensitive film patterns are highly magnified, and in practice, would be on a scale relative to the dimensions of the interference pattern created by the coherent beams 114A-B.

To generate a specific attenuation profile for the variable ND filter 126 for a particular arrangement of coherent beams 114A-B, photomask, photosensitive film, substrate, and other components in a MBIL setup, the photosensitive film may first be exposed using the coherent beams 114A-B without a variable ND filter, generating the intermediate photosensitive film pattern 312 (i.e., the undesired photosensitive film pattern) in the photosensitive film (e.g., photosensitive film 120). Based on this intermediate photosensitive film pattern 312, the attenuation profile of the variable ND filter 126 is created which when combined with the intermediate photosensitive film pattern 312, creates the target photosensitive film pattern 314 (i.e., the desired photosensitive film pattern). For example, the areas of opacity in the created variable ND filter 126 with the specific attenuation profile, should, when subtracted from the areas of exposure in the intermediate photosensitive film pattern 312, create the target photosensitive film pattern 314.

In some cases, a simple subtraction as in the example above cannot yield the target photosensitive film pattern 314, as there may be underexposed areas in the intermediate photosensitive film pattern 314 that are not exposed compared to the same regions in the desired photosensitive film pattern 314. In such a case, the configuration of the laser generators for the coherent beams 114A-B (e.g., the laser generators 112A-B), the photomask (e.g., the photomask 118), the photosensitive film (e.g., the photosensitive film 120), and other components of the MBIL setup may need to be modified in order to allow proper exposure to these underexposed regions. For example, the laser generators 112A-B may be configured with increased power, or the distance between the laser generators 112A-B and the photosensitive film 120 may be changed. After these modifications, the subtractive process above may be used to generate the attenuation profile the variable ND filter 126.

After applying the variable ND filter 126 with the specific attenuation profile, the target photosensitive film pattern 314 is generated. Although a particular pattern for the target photosensitive film pattern 314 is shown here, it is only an example and other patterns may also be used based on a design document or other requirement. Note that in the target photosensitive film pattern 314 the exposed regions are parallel to each other along the vertical direction 316 and do not deviate as in the intermediate photosensitive film pattern 312. Thus, by using the variable ND filter 126, the power of the coherent beams 114A-B is modulated in such a way as to create a photosensitive film pattern which can match the desired pattern of a design document, operator, or other requirement, despite the imperfections and variations due to the configuration of the MBIL setup.

In another embodiment, instead of experimentally determining the attenuation profile for the variable ND filter 126 as described above, the interference pattern generated by the coherent beams 114A and 114B is simulated based on an understanding of the known variances in power distribution of the two beams as generated by the laser generators 112A-B. The variable ND filter 126 is patterned to eliminate (i.e., subtract) the variance based on the simulation in a similar fashion to the experimentally determined method described above.

Figure 4:
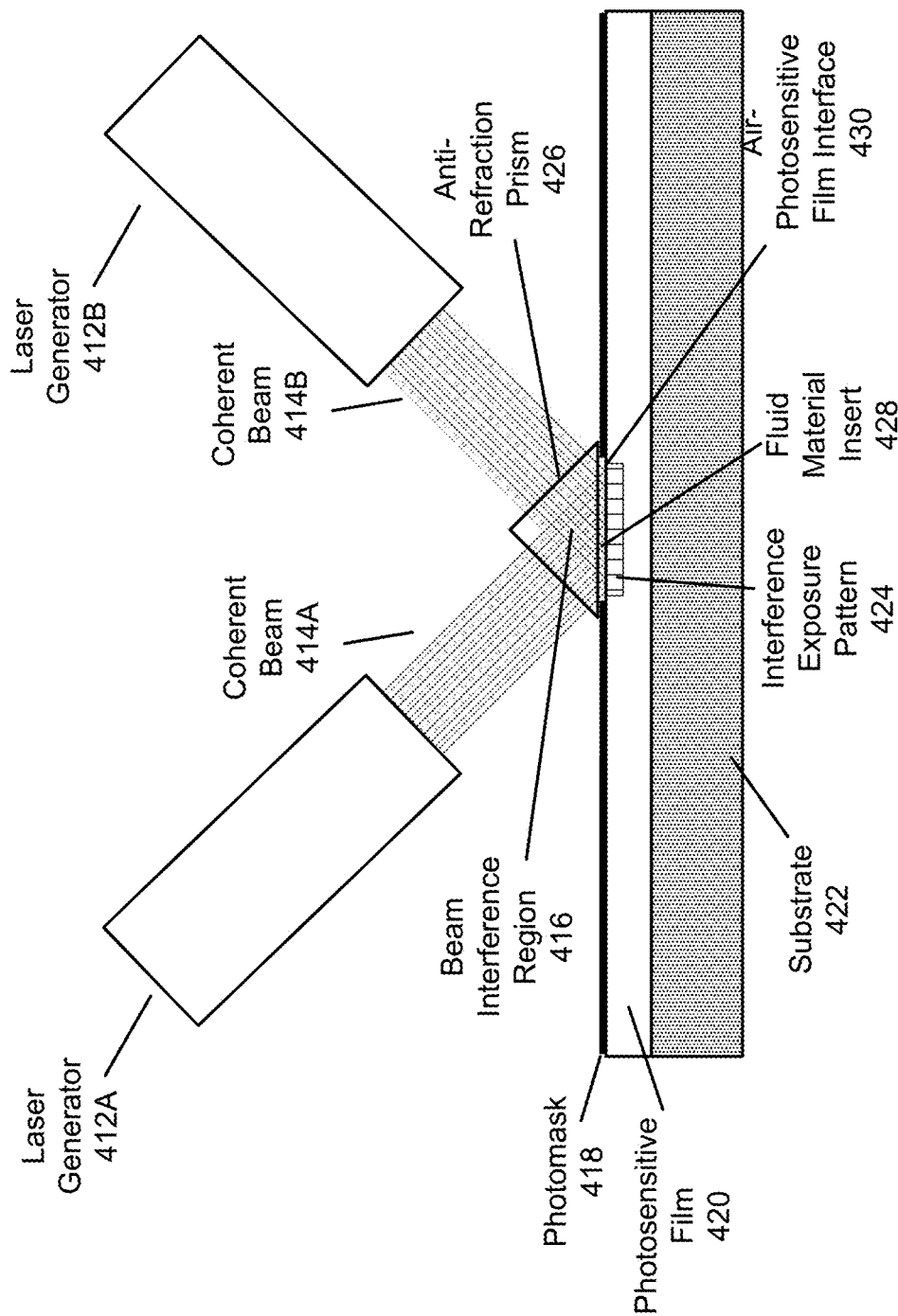
FIG. 4 is a diagram illustrating a profile view of a system for MBIL using a prism, according to one or more embodiments.

FIG. 4 is a diagram illustrating a profile view of a system 400 for multi beam interference lithography (MBIL) using a prism, according to one or more embodiments. The system 400 illustrates some of the components in MBIL, but may leave others out for clarity, and may not be drawn to scale. The system 400 includes two laser generators 412A and 412B that generate coherent beam 414A and coherent beam 414B, respectively, which interfere at a beam interference region 416. The beams are directed towards a structure that includes a substrate 422, a photosensitive film 420, and a photomask 418. Between the photomask 418 and the coherent beams 412A and 412B is an anti-refraction prism 426 to reduce or eliminate any refraction that occurs with the coherent beams 414A and 414B due to the air-photosensitive film interface 430 (i.e., the boundary between the air above the photosensitive film 420 and the photosensitive film 420 material). The system 400 may also optionally include a fluid material insert 428 within the gap of the photomask 418 where the photomask 418 is removed to allow the EM radiation from the coherent beams 414A and 414B to expose the photosensitive film 420.

The substrate 422 provides a foundation for the photosensitive film 420 and photomask 418 and may be similar to the substrate 122 of FIG. 1. The laser generators 412A-B generate the coherent beams 414A-B (respectively) of coherent EM radiation which are of a single wavelength or within a small range of wavelengths, and both the laser generators 412A, 412B, and the coherent beams 414A, 414B, may be similar to the laser generators 112A, 112B, and the coherent beams 114A, 114B of FIG. 1. The photomask 418 is made of a material that blocks the EM radiation of the coherent beams 414A-B from contacting the photosensitive film 420 at pre-determined areas of the photosensitive film 420, and may be similar to the photomask 118 of FIG. 1. The photosensitive film 420 is a material that when exposed to the wavelength of the EM radiation of the coherent beams 414A-B, either becomes soluble to a developer solution in the case of a positive photosensitive film, or insoluble to the developer solution in the case of a negative photosensitive film, and may be similar to the photosensitive film 120 of FIG. 1.

In the case where no anti-refraction prism 426 is present, when the coherent beams 414A and 414B interfere at the beam interference region 416 (which is in air) and then enter the photosensitive film 420, the beam of the interference pattern created by the two coherent beams 414A and 414B bend at an angle of refraction at the air-photosensitive film interface 430 (as determined by Snell's law). A further illustration of this refraction is described below with reference to FIG. 5A. However, by adding the anti-refraction prism 426, the angle of refraction is greatly reduced or eliminated. This is beneficial as the bending of the beams in the interference pattern due to the angle of refraction limits the slant and periodicity of the interference exposure pattern 424 on the photosensitive film. For example, due to the bending of the interference pattern, the maximum shear (or slant angle) that can be achieved for patterns in the photosensitive film may only be 30 degrees from the normal, and a higher shear cannot be achieved in the photosensitive film. Furthermore, due to the refraction, the periodicity, or amount of repetition per unit distance (or area) (i.e., pattern density) in the interference pattern is also limited. The reduction of the effects of refraction also reduce or eliminate any changes in phase or period which would have occurred without the anti-refraction prism 426 at the air-photosensitive film interface 430.

In one embodiment, the anti-refraction prism 426 is made of a material or combination of materials that has an index of refraction that is the same as that of the photosensitive film 420 or is within a small range (e.g., 5%) of the index of refraction of the photosensitive film 420. However, a larger difference between the index of refraction of the anti-refraction prism 426 and the photosensitive film 420 is also possible. The anti-refraction prism 426 has at least a surface facing each coherent beam 414A, 414B and a surface facing the photosensitive film 420. The surface of the anti-refraction prism 426 that faces each coherent beam 414A, 414B is normal to the angle of the respective coherent beam 414A, 414B. The surface of the anti-refraction prism 426 that faces the photosensitive film 420 is parallel to the surface of the photosensitive film 420. When a coherent beam 414A or 414B enters the anti-refraction prism 426, although there is an air-prism interface, because the surface of the anti-refraction prism 426 at the coherent beam 414A, 414B is normal to the angle of the coherent beam 414A, 414B, the coherent beam 414A or 414B does not bend and the phases within the beam do not change relative to each other. The two coherent beams 414A and 414B interfere at the beam interference region 416, similar to the interference which occurs in air, such as at the beam interference region 116. The resulting EM radiation from the interfered beams exits the prism and strikes the photosensitive film 420, creating an interference exposure pattern 424 corresponding to the constructive and destructive interference of the coherent beams 414A and 414B.

Although any gap between the anti-refraction prism 426 and the photosensitive film 420 can cause bending of the EM radiation that exits the anti-refraction prism 426 and strikes the photosensitive film 420, because the anti-refraction prism 426 and the photosensitive film 420 are parallel to each other, so long as the index of refraction of both the anti-refraction prism 426 and the photosensitive film 420 are similar or identical to each other, the angle of any beams of the EM radiation in the anti-refraction prism 426 will remain the same angle once the EM radiation enters the photosensitive film 420, even if the angle changes in the medium (e.g., air) between the anti-refraction prism 426 and the photosensitive film 420. Thus, the existence of a gap between the anti-refraction prism 426 and the photosensitive film 420 does not necessarily cause any significant undesirable effects. However, the gap should not be significantly large, as this may cause some of the EM radiation to no longer be incident upon the photosensitive film 420, as the beams of EM radiation may be bent and then deviate enough from the intended path such that they become incident upon the photomask 418, etc., instead of the photosensitive film 420. As an example, the gap may be less than 10 nm. The case described above holds true so long as the angle does not exceed the total internal reflection angle of the anti-refraction prism 426, as this would cause the EM radiation to reflect internally without exiting the anti-refraction prism 426. In such a case, a fluid or other material may be placed within the gap that has a higher refractive index than the anti-refraction prism 426.

In one embodiment, the index of refraction of the anti-refraction prism 426 is up to 5% higher than the index of refraction of the photosensitive film 420. This allows for a greater range of slant angles in the interference exposure pattern 424. In one embodiment, the gap between the anti-refraction prism 426 and the photosensitive film 420 is filled with a fluid material insert 428. This may be glass, water, or other fluid or solid that is transparent (or substantially transparent) to the EM radiation of the coherent beams 414A and 414B. Furthermore, this fluid material insert 428 may have an index of refraction that matches or is similar (e.g., within 5%) of the index of refraction of the anti-refraction prism 426 (and by extension the photosensitive film 420).

As shown, the anti-refraction prism 426 may rest partially upon the photomask 418, and may be adhered to the photomask 418 using optical glue. The photomask 418 is modified at the portion which is adjacent (underneath) the anti-refraction prism 426 to allow EM radiation from the coherent beams 414A and 414B through, while blocking the same EM radiation elsewhere. This allows the EM radiation through to create the interference exposure pattern 424.

Figure 5A:
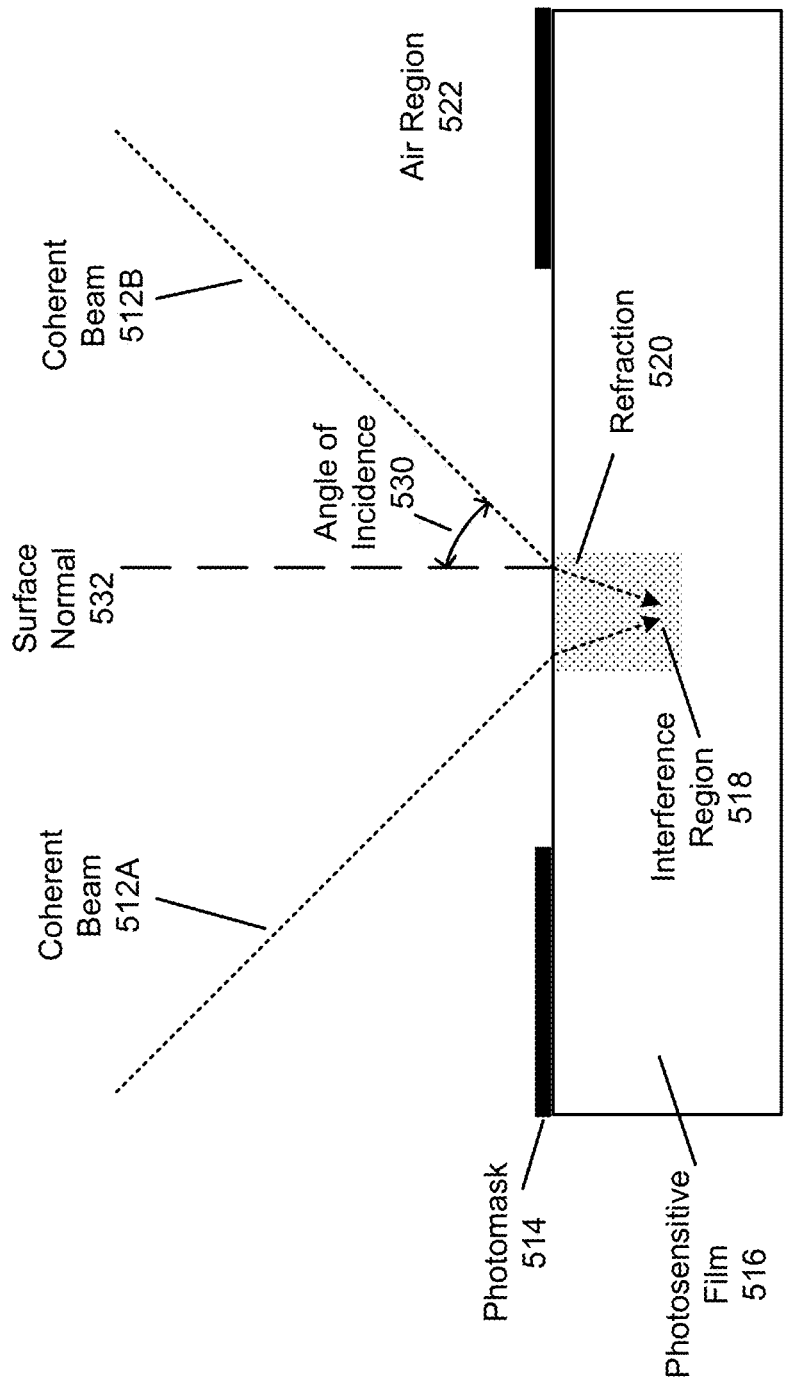
FIG. 5A illustrates the effect of refraction due to the air-photosensitive film interface in MBIL, according to one or more embodiments.

FIG. 5A illustrates the effect of refraction due to the air-photosensitive film interface in MBIL, according to one or more embodiments. As illustrated, FIG. 5 shows a photomask 514, photosensitive film 516, coherent beams 512A and 512B. These may be similar to the photomask 118, photosensitive film 120, and coherent beams 114A and 114B, of FIG. 1, respectively.

When either of the coherent beams 512A or 512B enter the photosensitive film 516, the difference between the index of refractions between the air region 522 and the photosensitive film 516 cause the refraction 520 to occur, due to the wavefront of the coherent beams not entering the photosensitive film at the same time because of the angle of incidence, causing a temporally uneven change in phase velocity of the coherent beams 512A and 512B and thus a bending of the beams. This causes the interference pattern slant angle, if the angle of incidence 530 is different for coherent beams 512A and 512B, to be reduced compared to that generated in air region 522. This slant causes a change in the pattern relative to an axis of a surface normal 532 of the photosensitive film 516. Due to this, the range of slant angles that can be achieved in the photosensitive film 516 are limited. As can be seen, due to the effects of refraction, the angle of incidence 530 of a coherent beam 512A or 512B on the photoresist film 516 does not cause the same angle of refraction within the photosensitive film 516. Thus, a shallow pattern angle (relative to the surface of the photomask 516) cannot be achieved in the photosensitive film 516 using the configuration described here.

Figure 5B:
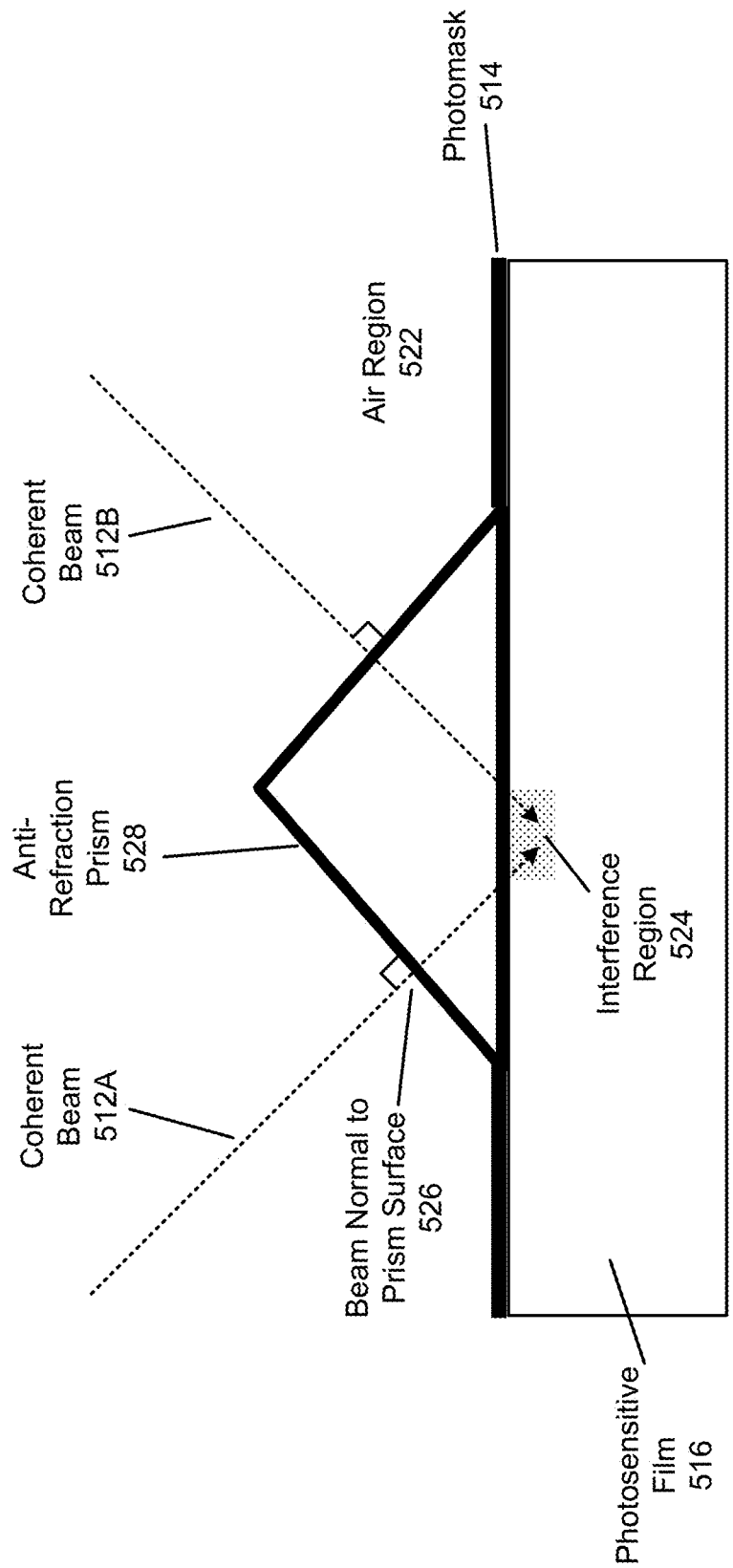
FIG. 5B illustrates the minimization of refraction due to the air-photosensitive film interface in MBIL by using an anti-refraction prism, according to one or more embodiments.

This is in contrast to FIG. 5B, which illustrates the minimization of refraction due to the air-photosensitive film interface in MBIL by using an anti-refraction prism, according to one or more embodiments. In contrast to FIG. 5A, in FIG. 5B an anti-refraction prism 528 is placed above the interference region 524 at the exposed area of the photosensitive film 516. This anti-refraction prism 528 may be similar to the anti-refraction prism 526 in FIG. 5. As indicated at 526, because the coherent beams 512A and 512B are normal to the surfaces of the anti-refraction prism 528 that face the coherent beams 512A and 512B, there is no angle of refraction as the coherent beams 512A and 512B enter the anti-refraction prism 528. Furthermore, due to the similarity in the index of refraction between the anti-refraction prism 528 and the photosensitive film 516, the slant angles of each coherent beam 512A and 512B are preserved (or are at a similar angle) when the coherent beams 512A and 512B enter the photosensitive film 516 at the interference region 524. As noted previously, because the photosensitive film-facing surface of the anti-refraction prism 528 and the incident surface of the photosensitive film 516 are parallel to each other, any gap between the two does not affect the angle of the coherent beams 512A and 512B within the photosensitive film 516.

Figure 6:
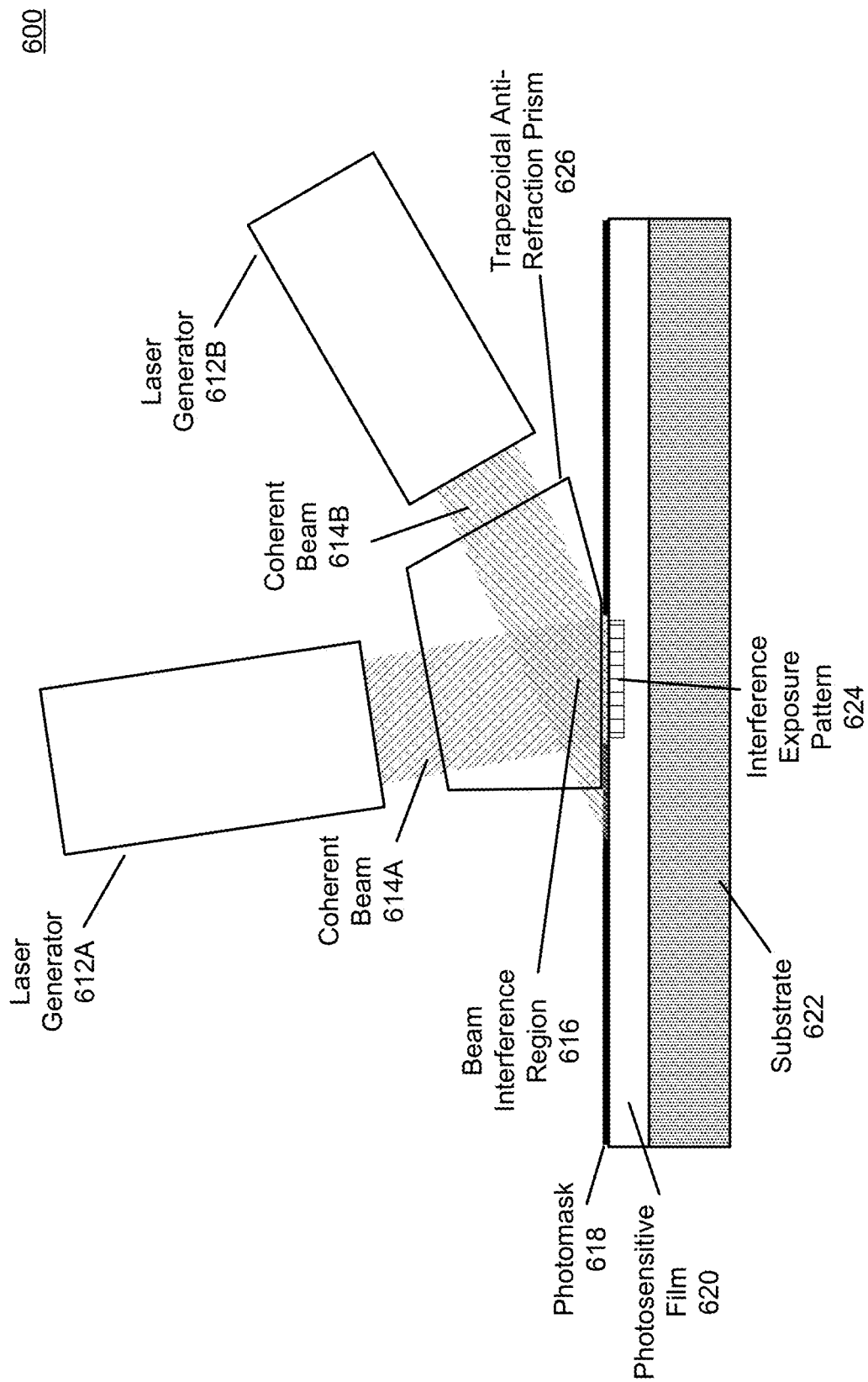
FIG. 6 is a diagram illustrating a profile view of an alternative system for MBIL using a trapezoidal prism, according to one or more embodiments.

FIG. 6 is a diagram illustrating a profile view of an alternative system 600 for multi beam interference lithography (MBIL) using a trapezoidal prism, according to one or more embodiments. In contrast to the system 400 in FIG. 4, the system 600 illustrated in FIG. 6 includes a trapezoidal anti-refraction prism 626. Furthermore, the angle of the laser generators 612A, 612B and the coherent beams 614A and 614B differ from the angles of the laser generators 412A, 412B and the coherent beams 414A and 414B in FIG. 4. The photomask 618, photosensitive film 620, and substrate 622 are similar to the photomask 418, photosensitive film 420, and substrate 422 of FIG. 4.

Due to this difference of the angles of the coherent beams 614A and 614B, a different interference exposure pattern 624 can be created in the photosensitive film 620. However, because the angles of the coherent beams 614A and 614B are different, a different anti-refraction prism may be needed. For example, a different anti-refraction prism may be needed to allow the coherent beams 614A and 614B to the surface of the anti-refraction prism to approach the normal of the anti-refraction prism. Thus, here, a trapezoidal anti-refraction prism 626 is utilized. The surfaces of the trapezoidal anti-refraction prism 626 which face the coherent beams 614A and 614B are orthogonal to the angle of the beams, whereas the surface of the trapezoidal anti-refraction prism 626 facing the photosensitive film 620 is parallel to the photosensitive film 620. The coherent beams 614A and 614B (generated by the laser generators 612A and 612B) interfere at the beam interference region 616 within the trapezoidal anti-refraction prism 626 and strike the photosensitive film 620 to create the interference exposure pattern 624.

While the shape of the anti-refraction prism 626 is trapezoidal, in other embodiments it can take on other shapes, and the surface facing the photosensitive film is parallel to the photosensitive film. Furthermore, the entire region of the photosensitive film on which the interference exposure pattern 624 is to be created is covered or obscured by the anti-refraction prism. Additionally, the region of beam interference between the two coherent beams which is used to create the interference exposure pattern should occur within the anti-refraction prism, as if the region were outside the prism, the EM radiation from the interfering beams would bend in undesirable ways.

Like the anti-refraction prism 426, the trapezoidal anti-refraction prism 626 has an index of refraction that is similar to that of the photosensitive film 620. Thus, the trapezoidal anti-refraction prism 626 significantly reduces or eliminates any bending of the EM radiation due to refraction. This allows for a greater angle of incidence in the beams that can enter the photosensitive film 620. For example, the coherent beam 614B, after interfering with the coherent beam 614A, may contribute to EM radiation that enters the photosensitive film 620 at a shallow angle relative to the surface of the photosensitive film 620, due to the lack of bending from refraction. This allows for the creation of a wider variety of interference exposure patterns 624 (e.g., those that require greater angles of incidence). Furthermore, the allowance of the greater angles of incidence allows for a smaller periodicity in the created interference exposure pattern 624, as the greater angle of incidence can allow more opportunities for beam interference (i.e., the beams will interfere with each other with greater regularity), and thus, smaller distances between repeating patterns.

Although two beams are shown here, in other embodiments, the number of beams is increased to allow for more complicated interference exposure patterns. For example, three beams may be able to generate a two dimensional interference exposure pattern, and four beams or more may be able to generate a three dimensional interference exposure pattern. In the case of the additional beams, an anti-refraction prism with additional faces may be used, with the prism having at least number of surfaces equal to the number of beams used, with an additional surface parallel to the surface or surfaces of the photosensitive film that is being exposed, as in some cases the photosensitive film may not be exposed on a single surface but on multiple different surfaces. For example, the photosensitive film may be a sphere, a cube, etc., with a cross section that varies over the length and the interference exposure pattern may create two dimensional patterns of holes, three dimensional lattices, and so on. This pattern may be created with coherent beams which are not angled along the same plane as each other, but in 3D space, with the anti-refraction prism also shaped in 3D and having a cross sectional profile that varies along its length.

Figure 7:
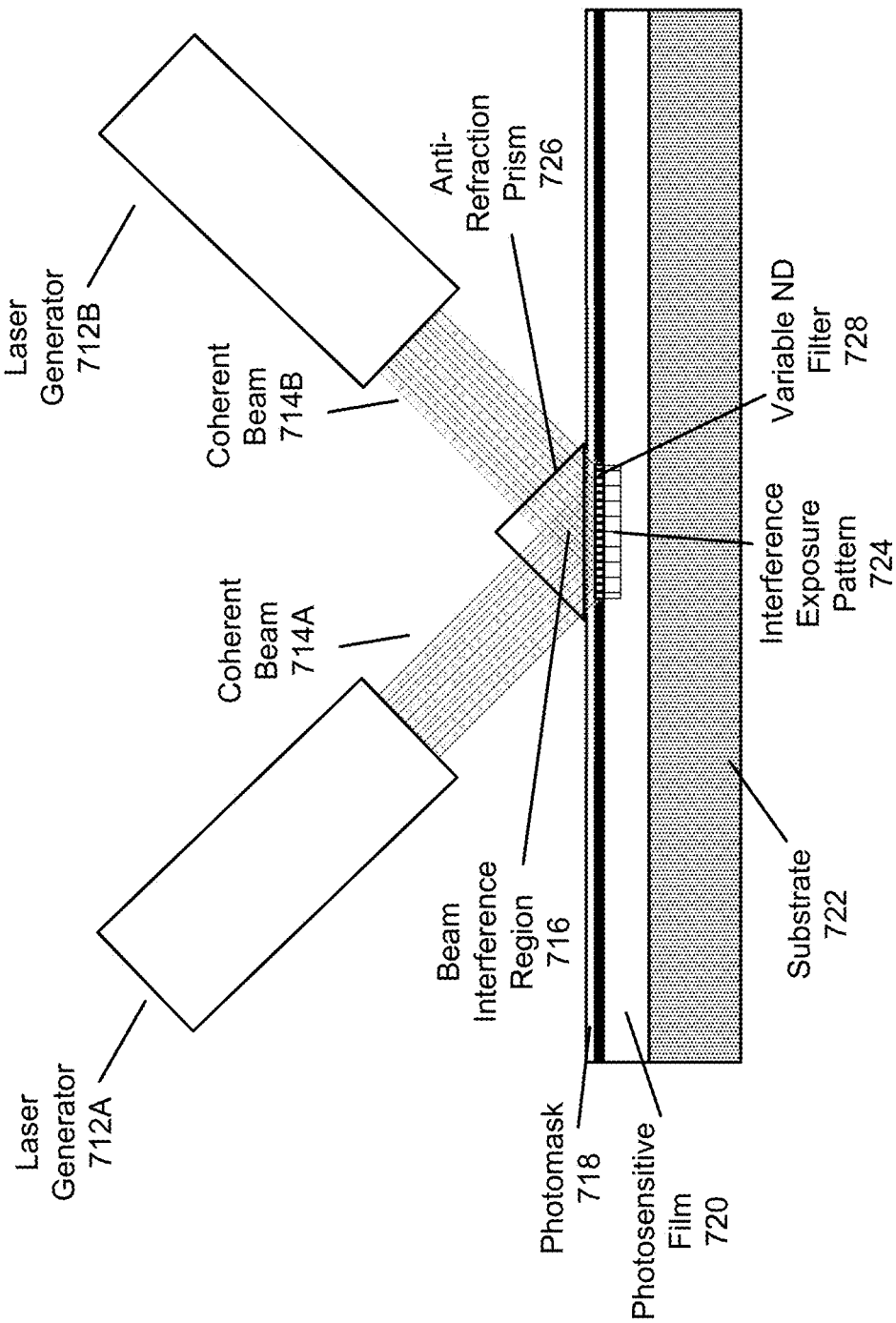
FIG. 7 is a diagram illustrating a profile view of an alternative system for MBIL using a prism and a variable ND filter, according to one or more embodiments.

FIG. 7 is a diagram illustrating a profile view of an alternative system 700 for multi beam interference lithography (MBIL) using a prism and a neutral density (ND) filter, according to one or more embodiments. In contrast to the system 400 in FIG. 4, the system 700 illustrated in FIG. 7 includes both an anti-refraction prism 726 as well as a variable ND filter 728. The photomask 618, photosensitive film 620, substrate 622, coherent beams 714A and 714B, and laser generators 712A and 712B are similar to the photomask 418, photosensitive film 420, substrate 422, coherent beams 414A and 414B, and laser generators 412A and 412B of FIG. 4.

Using the combination of both the anti-refraction prims 726 and the variable ND filter 728, the system 700 can reduce or eliminate the effects of refraction in the MBIL system, as well as reduce or eliminate the variances in the interference exposure pattern 724 due to the uneven distribution of power from the coherent beams 714A and 714B, as described previously with reference to FIG. 1.

Here, the variable ND filter 728 is placed adjacent to the photosensitive film 720, on the opposite side to the substrate 722, while the anti-refraction prism 726 may be placed directly above the variable ND filter 728 or above a fluid or other insert that is placed between the variable ND filter 728 and the anti-refraction prism 726. Placing the anti-refraction prism 726 above the variable ND filter 728 places it adjacent to the surface of the variable ND filter 728 that is opposite the side of the photosensitive film 720.

As the coherent beams 714A and 714B enter the anti-refraction prism 726, they are not bent as they are orthogonal to the surface of the anti-refraction prism 726. The coherent beams 714A and 714B interfere at the beam interference region 716, creating an interference pattern. This pattern may not match a target interference pattern, due to the variances in the power distribution of the coherent beams 714A and 714B. For example, as described above, the power distribution may be Gaussian, thus creating an interference pattern that may be of higher intensity than desired near the center of the pattern. The variable ND filter 728 is designed to attenuate the undesired regions of higher intensity in the interference pattern by blocking some of the EM radiation from passing through the variable ND filter 728. The resulting interference pattern, after passing through the variable ND filter 728, is a desired pattern, and the resulting interference exposure pattern 724 on the photosensitive film 720 is correctly created and according to design. The pattern on the variable ND filter 728 may be determined experimentally or via simulation, as described above, but with the addition of the anti-refraction prism 726 in the experimental determination process or simulation.

Figure 8A:
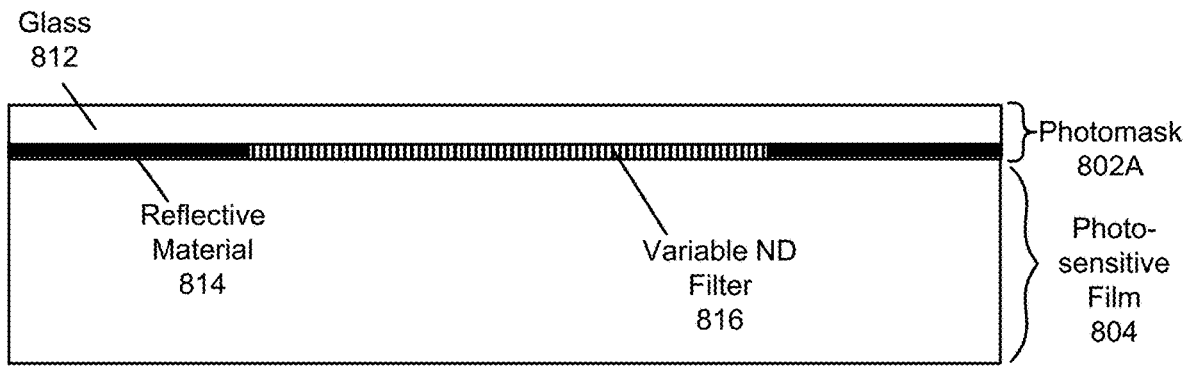
FIG. 8A illustrates an MBIL configuration with a photomask and a photosensitive film with a variable ND filter embedded in the photomask, according to one or more embodiments.

FIG. 8A illustrates an MBIL configuration with a photomask 802A and a photosensitive film 804 with a variable ND filter 816 embedded in the photomask 802A, according to one or more embodiments. In the following FIGS. 8A-C and accompanying descriptions, different placements of variable ND filters within the photosensitive film and photomask stack are described. Each may achieve similar results to that described in FIG. 1, but may be selected due to differences in manufacturing processes, coherent beam configuration, and type of photomask or photosensitive film used. Note that the diagram is not necessarily drawn to scale, and some elements are omitted for the purpose of clarity.

In FIG. 8A, the variable ND filter 816 is embedded within the photomask 802A, which may be composed of a glass 812 or other layer that is transparent to the EM radiation of the coherent beams of the MBIL process, and a reflective material 814 layer that is opaque to the same. The reflective material 814 may be chrome or other opaque material, and does not necessarily need to be reflective, but can also be absorptive. The reflective material 814 extends along the surface of the photomask 802A that is in contact with the photosensitive film 804, which may be similar to the photosensitive film 120. The opposite surface of the photomask 802A is where the coherent beams (e.g., coherent beams 114A-B) are incident upon. At the location of incidence, the reflective material 814 is not deposited or present on the photomask 804A, and thus EM radiation from the coherent beams is allowed through this region. However, the EM radiation does pass through the variable ND filter 816, which is placed within the photomask 802A adjacent to the photosensitive film 804 at a location of where the interference exposure pattern is created.

Figure 8B:
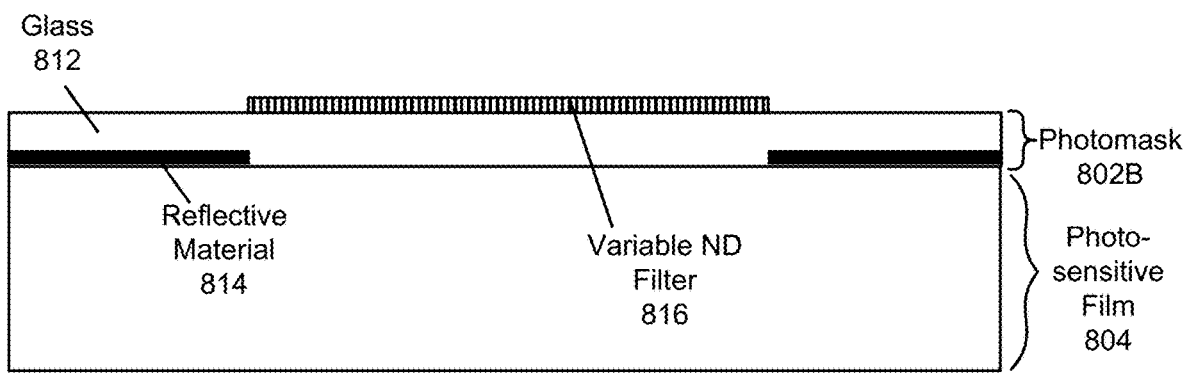
FIG. 8B illustrates an MBIL configuration with a photomask and a photosensitive film with a variable ND filter placed above the photomask, according to one or more embodiments.

FIG. 8B illustrates an MBIL configuration with a photomask 802B and a photosensitive film 804 with a variable ND filter 816 placed above the photomask 802B, according to one or more embodiments. In FIG. 8B, the variable ND filter 816 is placed above the photomask 802B, i.e., on the surface of the photomask 802B opposite the photosensitive film 804 and facing the coherent beams (e.g., coherent beams 114A-B). As placed here, the EM radiation from the coherent beams first encounters the variable ND filter 816, passes through it, and then passes through the photomask 804B, through the transparent opening in the photomask 802B where no reflective material 814 is applied, and strikes the photosensitive film 804.

Figure 8C:
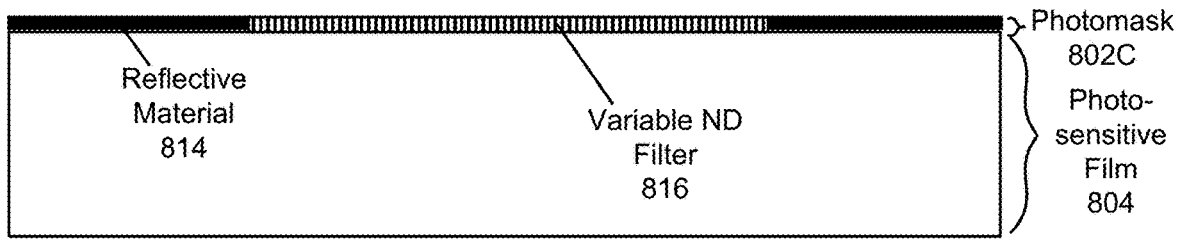
FIG. 8C illustrates an MBIL configuration with a photomask and a photosensitive film with a variable ND filter placed within a photomask with no glass portion, according to one or more embodiments.

FIG. 8C illustrates an MBIL configuration with a photomask 802C and a photosensitive film 804 with a variable ND filter 816 placed within a photomask 802C with no glass portion, according to one or more embodiments. In FIG. 8C, the variable ND filter 816 is placed within the photomask 802C, along the same plane as the reflective material 814 of the photomask 802C. However, in this case, the photomask 802C does not include a glass 812 layer. As placed here, the EM radiation from the coherent beams first encounters the variable ND filter 816, passes through it, and then strikes the photosensitive film 804. Such a configuration may be used when layer thickness is to be reduced, e.g., when EM radiation transmission loss is high, etc.

In one embodiment (not shown), no photomask is used, and only the variable ND filter 816 is placed on the surface of the photosensitive film 804 facing the coherent beams. Alternatively, the region where the photomask would be placed instead includes a variable ND filter with a pattern that allows zero transmittance of the EM radiation at the photomasked regions.

Figure 9A:
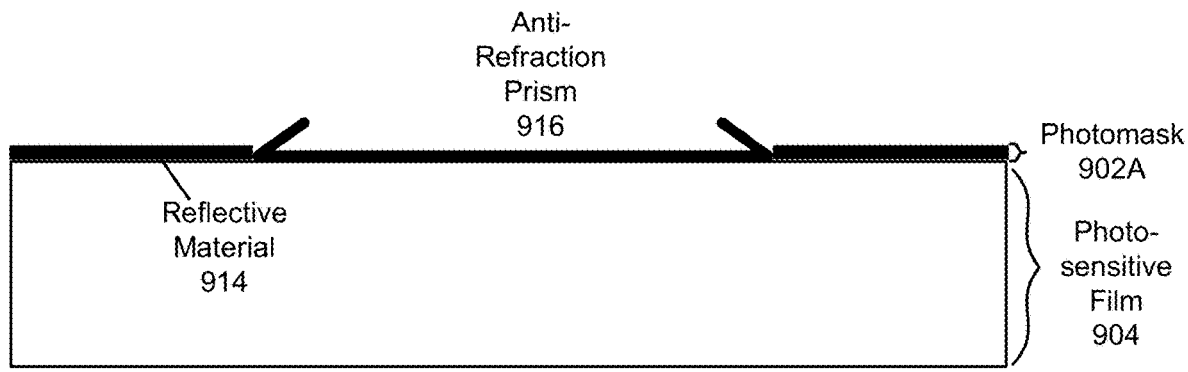
FIG. 9A illustrates an MBIL configuration with a photomask and a photosensitive film with an anti-refraction prism placed on the same plane as the photomask, according to one or more embodiments.

FIG. 9A illustrates an MBIL configuration with a photomask 902A and a photosensitive film 904 with an anti-refraction prism 916 placed on the same plane as the photomask 902A, according to one or more embodiments. In the following FIGS. 9A-C and accompanying descriptions, different placements of prisms within the photosensitive film and photomask stack are described. Each may achieve similar results to that described in FIG. 4, but may be selected due to differences in manufacturing processes, coherent beam configuration, and type of photomask or photosensitive film used. Note that the diagram is not necessarily drawn to scale, and some elements are omitted for the purpose of clarity. Furthermore, note that for purposes of illustration, the entire structure of the anti-refraction prism 916 is not shown, and only a bottom portion of the anti-refraction prism 916 is shown.

In FIG. 9A, the photomask 902A includes the reflective material 914, which may be similar to the reflective material 814. The anti-refraction prism 916 is placed within the opening of the photomask 902A layer where no reflective material 914 is present. The anti-refraction prism 916 may be affixed to the photosensitive film 904 using optical glue, or placed on the photosensitive film 904 without any adhesive. The photosensitive film 904 may be similar to the photosensitive film 420.

Figure 9B:
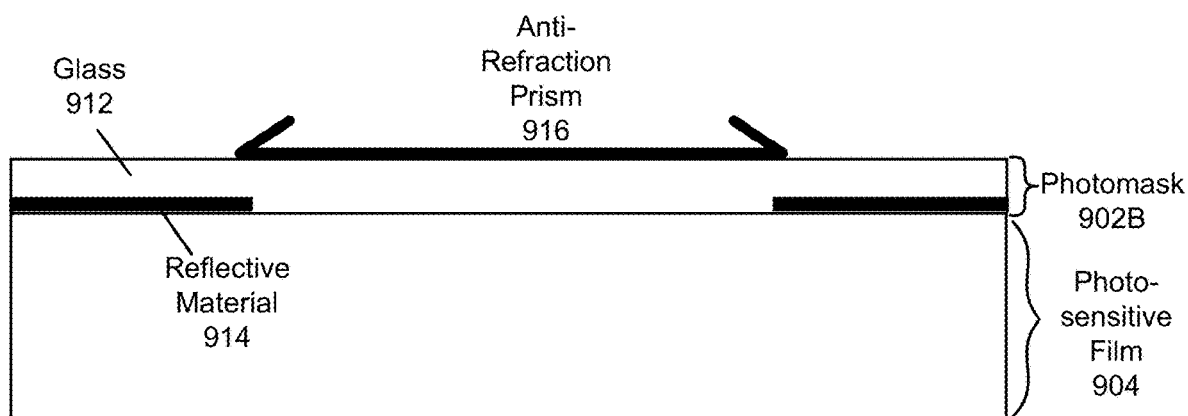
FIG. 9B illustrates an MBIL configuration with a photomask and a photosensitive film with an anti-refraction prism placed above the photomask with a glass portion, according to one or more embodiments.

FIG. 9B illustrates an MBIL configuration with a photomask 902B and a photosensitive film 904 with an anti-refraction prism 916 placed above the photomask 902B with a glass portion, according to one or more embodiments. In FIG. 9B, the anti-refraction prism 916 is placed above the photomask 902B, such that the photomask 902B is between the anti-refraction prism 916 and the photosensitive film 904. Furthermore, the photomask 902B includes both a glass 912 layer and a reflective material 914 layer. The reflective material 914 layer is between the glass 912 layer and the photosensitive film 904. The reflective material 914 layer obscures the photosensitive film 904 in areas where the EM radiation is to be blocked. The EM radiation passes through the anti-refraction prism 916, through the glass 912 layer, and strikes the photosensitive film 904. The anti-refraction prism 916 may be adhered to the photomask 902B using optical glue. The glass 912 may have a similar index of refraction (within a threshold) to the anti-refraction prism 916.

Figure 9C:
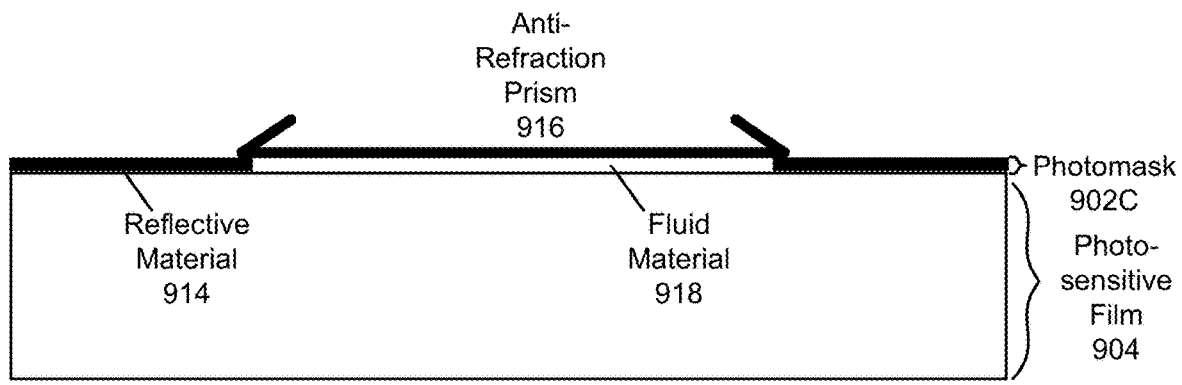
FIG. 9C illustrates an MBIL configuration with a photomask and a photosensitive film with an anti-refraction prism placed above the photomask without a glass portion, according to one or more embodiments.

FIG. 9C illustrates an MBIL configuration with a photomask 902C and a photosensitive film 904 with an anti-refraction prism 916 placed above the photomask 902C without a glass portion, according to one or more embodiments. In FIG. 9C, the anti-refraction prism 916 is placed above the photomask 902C, such that the photomask 902C is between the anti-refraction prism 916 and the photosensitive film 904. Unlike in FIG. 9B, the photomask 902C includes only a layer of reflective material 914. This also means that a gap exists between the surface of the anti-refraction prims 916 facing the photosensitive film 904, and the surface of the photosensitive film 904, as shown. This gap may be filled with a fluid material 918, which may be any gas or liquid (e.g., water). The index of refraction of the fluid material 918 may be dissimilar (beyond a threshold value) from the index of refraction of the anti-refraction prism 916. However, as noted above, this does not impact the available slant angles for the photosensitive film 904. Thus, the EM radiation passes through the anti-refraction prism 916, through the opening in the photomask 902C, which may be filled with a fluid material 918, and strikes the photosensitive film 904.

Although the above examples have been shown with the anti-refraction prism 916 and/or the variable ND filter 816 on one surface of the photosensitive film, in other embodiments both (opposite) surfaces of the photosensitive film may have an anti-refraction prism 916 and/or variable ND filter 816. In such a case, coherent beams may be directed towards the photosensitive film in opposite directions. These coherent beams interfere on the opposite surfaces of the photosensitive film to generate two different target interference patterns.

Figure 10A:
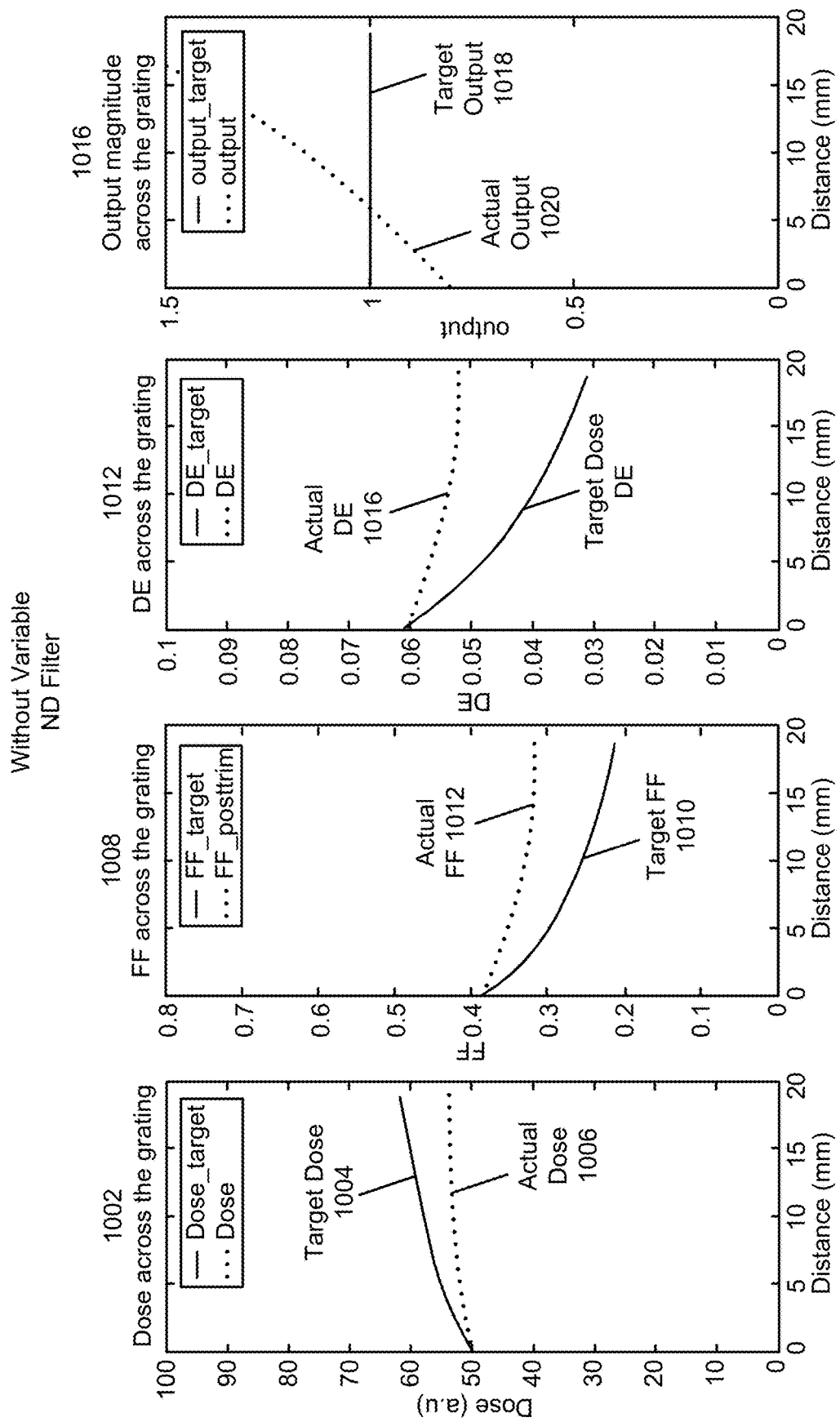
FIG. 10A illustrates various transmission graphs for an MBIL process without a variable ND filter, according to one or more embodiments.

FIG. 10A illustrates various transmission graphs for an MBIL process without a variable ND filter, according to one or more embodiments. Although specific values are shown in the graphs here, these are only exemplary and in other cases may vary significantly.

Figure 10B:
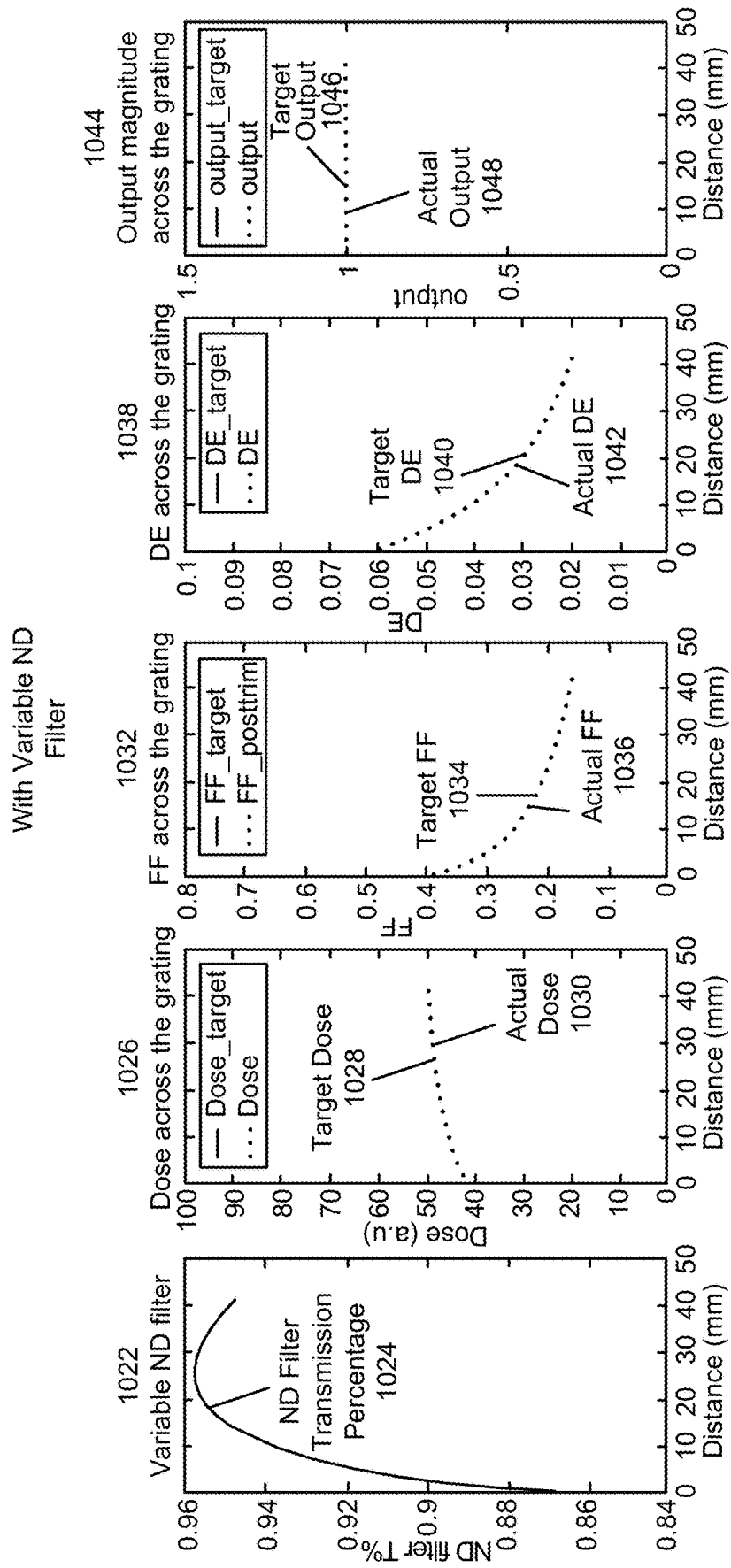
FIG. 10B illustrates various transmission graphs for an MBIL process with a variable ND filter, according to one or more embodiments.

As shown, and in comparison with the graphs in FIG. 10B where the variable ND filter is applied, the actual dose 1006, actual FF 1012, actual DE 1016, and actual output 1020 deviate significantly from the target dose 1004, target FF 1012, target DE 1016, and target output 1020, for each of the graphs of dose across the grating 1002, FF across the grating 1008, DE across the grating 1012, and output magnitude across the grating 1016, respectively. Each of these charts plots, for the horizontal axis, the distance in mm (millimeters) from a starting point on the photosensitive film. Although the photosensitive film is two dimensional, the measurements here are taken from a single one dimensional linear path along the photosensitive film (that is parallel to one edge of the photosensitive film). The units for the vertical axis differ based on the value being measured.

FIG. 10B illustrates various transmission graphs for an MBIL process with a variable ND filter, according to one or more embodiments. Although specific values are shown in the graphs here, these are only exemplary and in other cases may vary significantly. FIG. 10B includes the graphs dose across the grating 1026, FF across the grating 1032, DE across the grating 1038, and output magnitude across the grating 1044, which are similar to the graphs of the same titles of 1002, 1008, 1012, and 1016, in FIG. 10A, respectively. Additionally, FIG. 10B includes graph 1022, which shows the transmission percentage 1024 allowed by the variable ND filter over the same distance as the previously noted graphs. As shown, the variable ND filter transmission percentage begins at distance 0 at approx. 0.86. The transmission percentage peaks at an approx. distance of 27, at an approx. transmission percentage of 0.96. The transmission percentage curve for this variable ND filter may have been created by taking a combination of target values in the graphs of FIG. 10A and subtracting these from the actual values in the same graphs.

The result of the application of the variable ND filter is shown in the graphs 1026, 1032, 1038, and 1044. As shown, the target dose 1028, target FF 1034, target DE 1040, and target output 1046 very closely match the actual dose 1030, actual FF 1036, actual DE 1042, and actual output 1048. This indicates that the intermediate interference exposure pattern matches the target or target interference exposure pattern, and the effects of the uneven power distribution and other undesired characteristics from the MBIL process are eliminated or reduced significantly.

Figure 11:
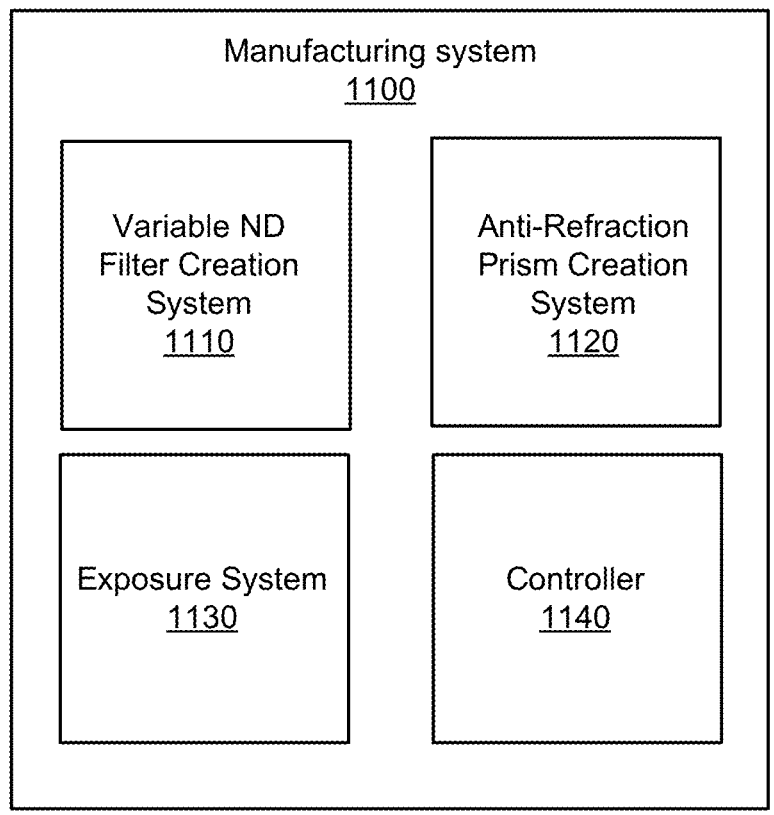
FIG. 11 is a block diagram of a manufacturing system, in accordance with one embodiment.

FIG. 11 is a block diagram of a manufacturing system 1100, in accordance with one embodiment. The manufacturing system 1100 is a group of devices that may be used to produce some of the components in systems 100, 400, 600, 700, and so on, as described above, such as the variable ND filter 126. The manufacturing system 1100 includes a variable ND filter creation system 1110, an anti-refraction prism creation system 1120, an exposure system 1130, and a controller 1140, or some combination thereof. The manufacturing system 1100 may be similar to a system of fabricating devices used to form an integrated circuit, and may include such components as an etching component, a thin film manufacturing component, an oxidation component, and so on.

The variable ND filter creation system 1110 creates the optical grating of a variable ND filter, such as the variable ND filter 126. The variable ND filter creation system 1110 may receive instructions, e.g., from a controller such as controller 1140, to create a variable ND filter based on a set of specifications, which may include the size of the variable ND filter to be created and the attenuation profile of the variable ND filter to be created. The variable ND filter creation system 1110 may then create a variable ND filter according to the specifications. In one embodiment, the variable ND filter creation system 1110 may use 3D printing techniques to layout polymer strands in a thin film. The density profile of the polymer strands across the thin film corresponds to the attenuation profile specified in the instructions. Thus, the density of the polymer strands may be higher where the attenuation profile indicates that more light should be obstructed (i.e., the modulation of the light passing through should be higher). In another embodiment, the variable ND filter may be created lithographically. A negative may be created using known lithographic printing techniques. This negative may have a profile that is the opposite of the attenuation profile in the specifications. A thin film, which is at least the size of the specified variable ND filter, is exposed to the negative, in order to create the variable ND filter with the specified attenuation profile.

In another embodiment, the variable ND filter creation system 1110 may create the variable ND filter by varying the thickness (e.g., via ablation, etching, or other technique) of a material (e.g., metal) with high absorption in the EM wavelength range of the coherent beams. In another embodiment, the variable ND filter creation system 1110 varies the thickness of a polymer film, which may have less absorption compared to the high absorption material described above. This polymer fil may be a graytone photosensitive film. The variable ND filter creation system 1110 may expose it with a scanning laser (rastering across the filter with different intensity to vary the exposure amount) or use a mask aligner and conventional lithography to pattern whole surface at once. The photosensitive film is then developed and has a variable thickness across the filter, and thus a variable absorption that is needed for the variable neutral density filter.

Although multiple methods of creating the variable ND filter are described here, in other embodiments the variable ND filter may be created in different ways.

The anti-refraction prism creation system 1120 creates prisms, such as the anti-refraction prism 426. The anti-refraction prism creation system 1120 may receive from a controller, such as controller 1150, a set of specifications indicating a shape of a prism, as well as the material to use for the prism (which has a proper index of refraction matching or similar to the EM radiation of incident coherent beams, as noted above). The anti-refraction prism creation system 1120 may use mechanical cutting, laser cutting, fluid-based cutting, ablative, or other means to shape a received prism material to the desired specifications. The prism may be further polished using various mechanisms, such as a diamond or laser polisher. The anti-refraction prism creation system 1120 may deposit the completed prism on the surface of a photomask or photosensitive film, depending on the configuration of the photomask or photosensitive film The exposure system 1130 exposes a photosensitive film, such as the photosensitive film 120, 420, 620, and so on, to two or more coherent beams, and with the use of a variable ND filter, such as variable ND filter 126, and/or the anti-refraction prism 426. The exposure system 1130 includes a substrate assembly on which a substrate, such as substrate 122, may be placed. The substrate assembly may have mechanisms to swap in and swap out different substrates, allowing multi beam interference lithography on multiple photosensitive films in an assembly line fashion. The exposure system 1130 may also include a laser generator frame assembly to affix one or more laser generators, such as the laser generators 112A-B, to a specific slant angle and distance from the substrate assembly such that the interference between the coherent beams of the laser generators creates the target interference exposure pattern on the photosensitive film. The exposure system 1130 may also include an adjustment device placement assembly to place either the variable ND filter (e.g., variable ND filter 126) or the anti-refraction prism (anti-refraction prism 426) on top of the photosensitive film to cover the entire photosensitive film and to be at a specified position, such that, as described above, the variable ND filter and/or the anti-refraction prism can adjust the modulation and/or path of the coherent beams as they enter the photosensitive film. The adjustment device placement assembly may place and remove the variable ND filter and/or anti-refraction prism for each photomask and substrate assembly that is passed through the exposure system 1130. The exposure system 1130 may also place a photomask, such as photomask 118, on the photosensitive film. The exposure system 1130 may receive instructions from the controller 1140 regarding which variable ND filter or anti-refraction prism to use, which target interference pattern to create, the position and angles of the laser generators, which substrate and photosensitive film to use, and so on.

The controller 1140 transmits instructions to the various systems of the manufacturing system 1110. In addition to instructing the variable ND filter creation system 1110 and the anti-refraction prism creation system 1120 with creating the respective elements, the controller 1140 also instruct the laser generators of the exposure system 1130, such as laser generators 112A and 112B, or laser generators 412A and 412B, to emit EM radiation of a specific configuration, such that the coherent beams that are generated may create the desired or target interference exposure pattern in a photosensitive film that is incident to the beams, such as photosensitive film 120 or 420. The controller 1140 may further instruct the various assemblies of the exposure system 1130 to form and place the various components of the systems 100, 400, 600, 700, and so on, as described above, such as the substrate 112, photosensitive film 120, photomask 118, and so on. The controller 1140 may instruct the exposure system 1130 to place different photosensitive films for exposure to the EM radiation in succession, in an assembly line fashion, with each photosensitive film receiving the same or a different interference exposure pattern. The controller 1140 may instruct the exposure system 1130 to place different variable ND filters and/or anti-refraction prisms, change the configuration of the laser generators (e.g., the slant angle, etc.) for each photosensitive film to be exposed, in order to generate different patterns.

Additional Considerations

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method, comprising:
    disposing a photosensitive film layer on a surface of a substrate layer;
    placing a variable neutral density (ND) filter such that a surface of the variable ND filter faces an exposure region of the photosensitive film layer, wherein the variable ND filter is a thin film that has an attenuation profile that modulates transmittance of light passing through the variable ND filter to the exposure region to cancel out an uneven power distribution in an intermediate interference exposure pattern at the exposure region of the photosensitive film layer; and
    arranging one or more laser generators such that at least two generated beams of light from the one or more laser generators intersect with each other and form the intermediate interference exposure pattern that is modulated by the variable ND filter to form a target interference exposure pattern at the exposure region of the photosensitive film layer.

2. The method of claim 1, wherein the attenuation profile is created based on a subtraction of an interference exposure pattern generated without the variable ND filter and a target interference exposure pattern.

3. The method of claim 1, wherein the attenuation profile of the variable ND filter is sinusoidal in at least one dimension.

4. The method of claim 1, wherein the attenuation profile of the variable ND filter varies in two dimensions.

5. The method of claim 1, wherein the thin film is composed of plasticine polymer.

6. The method of claim 1, wherein the thickness of the thin film is between $1/10^{th}$ and $1/20^{th}$ of a wavelength of the at least two coherent beams.

7. The method of claim 1, wherein the variable ND filter is placed within a photomask layer.

8. The method of claim 7, wherein the photomask layer includes a glass layer and a reflective layer, the variable ND filter placed within the reflective layer.

9. The method of claim 7, wherein a photomask layer is placed between the variable ND filter and the photosensitive film layer.

10. The method of claim 1, further comprising:
    placing an anti-refraction prism with an egress surface facing the variable ND filter, wherein the anti-refraction prism has a plurality of incident surfaces, each of the plurality of incident surfaces normal to each of the coherent beams, the coherent beams interfering within the anti-refraction prism and exiting at the egress surface; and
    wherein the anti-refraction prism has a refraction index within a threshold range of the refraction index of the photosensitive film layer, and wherein the anti-refraction prism reduces a change in angle of each coherent beam in the photosensitive film layer due to refraction.

* * * * *